United States Patent
Yoshida

(10) Patent No.: US 7,521,904 B2
(45) Date of Patent: Apr. 21, 2009

(54) METHOD AND DEVICE FOR DETECTING ERRORS IN CHARGING LINES

(75) Inventor: Ko Yoshida, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/005,279

(22) Filed: Dec. 27, 2007

(65) Prior Publication Data

US 2008/0157725 A1  Jul. 3, 2008

(30) Foreign Application Priority Data

Dec. 27, 2006  (JP)  ............................ 2006-352494

(51) Int. Cl.
*H02H 11/00* (2006.01)
*H02P 9/00* (2006.01)
(52) U.S. Cl. ........................................ 322/24; 322/28
(58) Field of Classification Search .................. 322/24, 322/26, 28, 44, 59; 307/10.1; 320/104
See application file for complete search history.

(56) References Cited

U.S. PATENT DOCUMENTS

| | | | |
|---|---|---|---|
| 5,151,646 A | 9/1992 | Vercesi et al. | |
| 6,664,767 B2 * | 12/2003 | Takahashi et al. | 322/28 |
| 7,329,966 B2 * | 2/2008 | Konishi | 307/10.1 |
| 7,423,351 B2 * | 9/2008 | Maehara | 290/40 C |
| 7,443,143 B2 * | 10/2008 | Sasaki et al. | 322/24 |
| 2002/0027425 A1 * | 3/2002 | Asao et al. | 322/28 |
| 2006/0139012 A1 * | 6/2006 | Iwatani et al. | 322/28 |
| 2008/0157594 A1 * | 7/2008 | Peterson et al. | 307/10.1 |

FOREIGN PATENT DOCUMENTS

JP  B2 2954374  9/1999

* cited by examiner

*Primary Examiner*—Julio Gonzalez
(74) *Attorney, Agent, or Firm*—Oliff & Berridge, PLC

(57) ABSTRACT

In a device for detecting errors in a charging line, the device detects an error in the charging line connecting the vehicle generator and an on-board battery. The device includes a bias circuit, a charging line error detecting means, and a warning means. The bias circuit biases a voltage of an external terminal receiving the power generation instruction signal in the vehicle power generation controller with a voltage of an output terminal of the vehicle generator. The charging line error detecting means detects the error in the charging line based on a voltage of an output terminal of the power generation instructing means that is provided within the external controller and generates the power generation instruction signal and a terminal voltage of the on-board battery. When the charging line error detecting means detects the error in the charging line, the warning means performs a warning operation to give notification of the error.

5 Claims, 1 Drawing Sheet

METHOD AND DEVICE FOR DETECTING ERRORS IN CHARGING LINES

CROSS-REFERENCE TO RELATED APPLICATION

This application is related to Japanese Patent Application NO. 2006-352494 filed on Dec. 27, 2006, the contents of which are hereby incorporated by reference.

BACKGROUND OF THE INVENTION

1. Field of the Invention

The present invention relates to a device that detects an error in charging lines connecting a vehicle generator and an on-board battery.

2. Description of the Related Art

Conventionally, a following charging system for an automobile battery is known (refer to, for example, Japanese Patent No. 2954374). In battery charging systems, a voltage regulator (vehicle power generation controller) constantly monitors battery voltage. As a result, a non-contact state of the charging line connecting the vehicle generator and the battery (i.e., charging line disconnection or the like) can be detected. In the battery charging system, the voltage regulator is provided with an external terminal (called "L"). The non-contact state of the charging line can be detected by comparing the battery voltage at the terminal with the output voltage of the vehicle generator.

In the charging system disclosed in the Patent Document, the voltage regulator itself is required to monitor the battery voltage. Therefore, an external terminal and associated wiring are required. The structure of the voltage regulator and the wire routing are complicated. In particular, an increase has recently been seen in the number of power generation systems in which an electronic control unit (ECU) on the vehicle-side performs complex power generation instructions and the like. In a power generation system such as this, an external communication terminal connected to the vehicle-side ECU, via a communication line, is also required. Therefore, the number of external terminals should preferably be kept to a minimum.

SUMMARY OF THE INVENTION

The present invention has been made in light of the above-described issues. An object of the invention is to provide a device for detecting an error in charging lines, which can simplify the structure of the vehicle power generation controller and wire routing by reducing the number of external terminals.

To solve the above-described issues, in the device of the invention, a power generation instruction signal is transmitted from an external controller to a vehicle power generation controller controlling a power generation state of a vehicle generator. The device detects an error in the charging line connecting the vehicle generator to the on-board battery. The charging line detection device includes a bias circuit, a charging line error detecting means, and a warning means. The bias circuit biases the voltage of the external terminal receiving the power generation instruction signal in the vehicle power generation controller with the voltage of the output terminal of the vehicle generator. The charging line error detecting means detects the error in the charging line based on the voltage of the output terminal of the power generation instructing means and the terminal voltage of the on-board battery. The power generation instructing means is provided within the external controller and generates the power generation instruction signal. When the charging line error detecting means detects an error in the charging line, the warning means performs a warning operation to give notification of the error. The occurrence of an error in the charging line can be detected by the voltage of a signal line, over which the power generation instruction signal is transmitted in the external controller. Therefore, other than an external connection terminal to which the signal line is connected on the vehicle power generation controller side, a separate external terminal used for error detection is not required. The number of external terminals in the vehicle power generation controller can be reduced. The structure of the vehicle power generation controller and wire routing can be simplified.

The above-described bias circuit is a pull-up resistor. The power generation instructing means includes a switching element provided between a communication line and a ground terminal. The communication line is connected between the external terminal and the output terminal. The charging line error detecting means preferably obtains the voltage of the output terminal and performs an error detection of the charging line when the switching element is turned OFF. As a result, detection of the output voltage of the vehicle generator and error detection of the charging line can be performed without significant changes being made to the configurations of the vehicle power generation controller and the external controller.

The above-described charging line error detecting means preferably judges that an error has occurred in the charging line when the difference between the voltage of the output terminal and the terminal voltage of the on-board battery exceeds a predetermined value. An error in the charging line can be easily detected simply through voltage comparison.

DETAILED DESCRIPTION OF THE PREFERRED EMBODIMENTS

Figure 1:
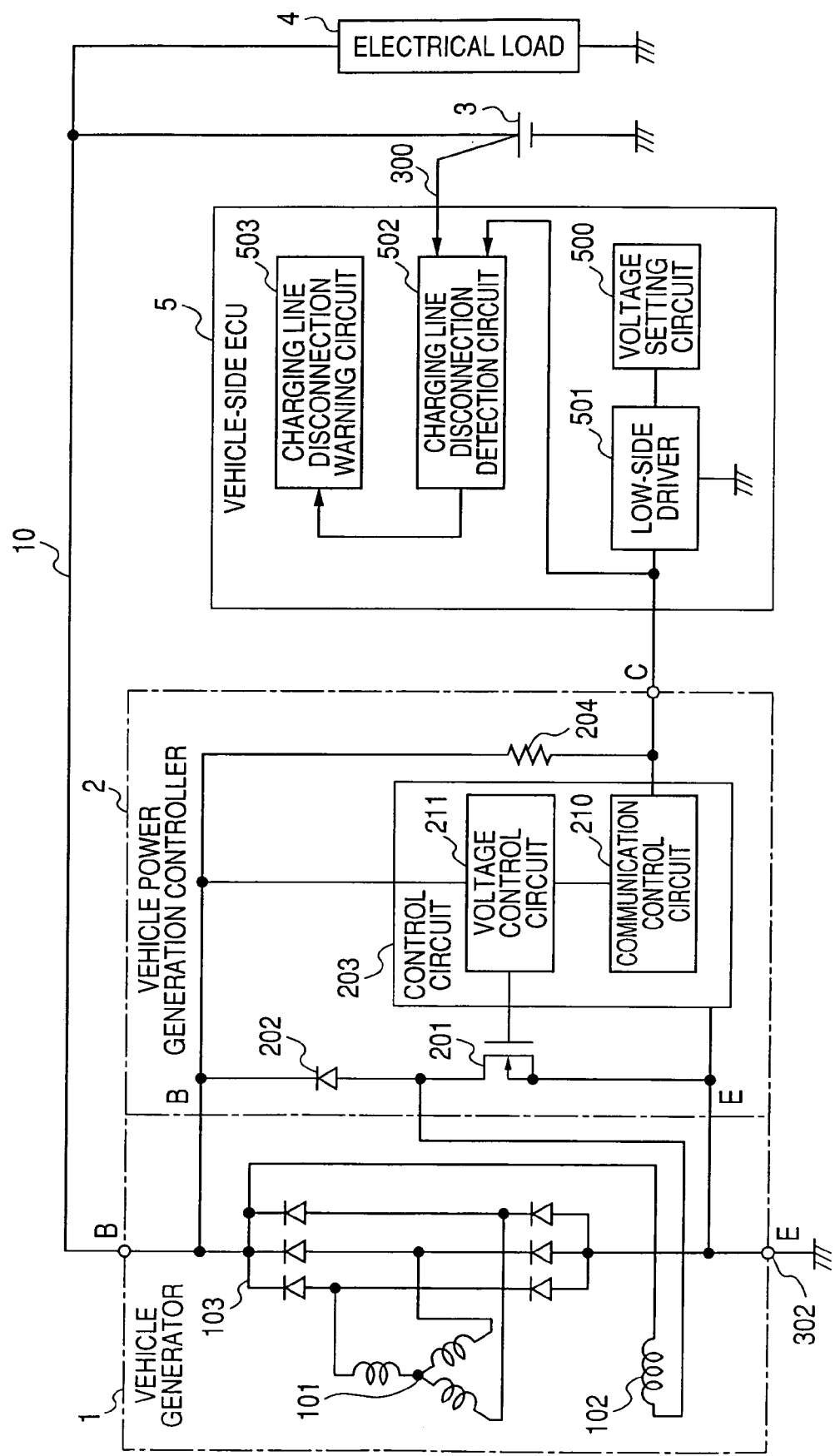
FIG. 1 is a diagram of a configuration of an on-board system according to an embodiment of the present invention.

An on-board system according to an exemplary embodiment to which a charging line error detection system of the present invention is applied is described below with reference to the attached drawing. FIG. 1 is a diagram of the configuration of the on-board system according to the embodiment to which the invention is applied.

In FIG. 1, a vehicle power generation controller 2 is used to control the power generation such that the voltage of the output terminal (B terminal) of the vehicle generator 1 is a predetermined regulated voltage setting value (for example, 14 volts). In addition to the B terminal, the vehicle power generation controller 2 has a communication terminal (called "C" terminal) and a ground terminal (called "E" terminal) as external terminals. The B terminal is connected to an on-board battery 3 and various electrical loads 4, via a charging line 10. The C terminal is connected to a vehicle-side ECU 5 serving as an external controller. The E terminal is a ground terminal connected to the frame of the vehicle generator 1. In FIG. 1, the vehicle power generation controller 2 is shown in parallel with the vehicle generator 1. However, in actuality, the vehicle power generation controller 2 is installed within the vehicle generator 1.

The vehicle generator 1 includes a three-phase stator winding 101, an excitation winding 102, and a rectifier circuit 103. The stator winding 101 is on a stator. The excitation winding 102 is included within a rotor. The rectifier circuit 103 is provided to perform full-wave rectification on the three-phase output of the stator winding 101. The output voltage of the vehicle generator 1 is controlled by the vehicle power generation controller 2 intermittently supplying a voltage to the excitation winding 102 in an appropriate manner.

Next, detailed configurations and operations of the vehicle power generation controller 2 and the vehicle-side ECU 5 will be described. As shown in FIG. 1, the vehicle power generation controller 2 includes an N-channel metal-oxide-semiconductor field-effect transistor (MOS-FET) 201, a flyback diode 202, a control circuit 203, and a pull-up resistor 204. The MOS-FET 201 is connected in series to the excitation winding 102. When the MOS-FET 201 is ON, excitation current flows through the excitation winding 102. The flyback diode 202 is connected in parallel to the excitation winding 102. The flyback diode 202 performs a reflux of the excitation current when the MOS-FET 201 is OFF.

The control circuit 203 intermittently controls the MOS-FET 201 such that the B terminal voltage in the vehicle generator 1 is a predetermined regulated voltage. The control circuit 203 includes a communication control circuit 210 and a voltage control circuit 211. The communication control circuit 210 is connected to the C terminal. The communication control circuit 210 receives a power generation instruction signal sent from the vehicle-side ECU 5, via a signal line connected to the C terminal. For example, the power generation signal is a square wave signal having a duty ratio corresponding to the regulated voltage value. The communication control circuit 210 detects the duty ratio of the power generation instruction signal received via the C terminal. Then, the communication control circuit 210 inputs the regulated voltage value corresponding to the detected duty ratio into the voltage control circuit 211. The voltage control circuit 211 generates a driving signal having a predetermined duty ratio such that the regulated voltage value inputted from the communication control circuit 210 and the B terminal voltage in the vehicle generator 1 match. The driving signal is inputted into a gate of the MOS-FET 201. The MOS-FET 201 is driven based on a voltage level of the driving signal.

The pull-up resistor 204 is inserted between the B terminal and the C terminal. The pull-up resister 204 serves as a bias circuit for biasing the voltage of the C terminal with the voltage of the B terminal.

As shown in FIG. 1, the vehicle-side ECU 5 includes a voltage setting circuit 500, a low-side driver 501, a charging line disconnection detection circuit 502, and a charging line disconnection warning circuit 503. The voltage setting circuit 500 is used to set the regulated voltage of the vehicle generator 1. The voltage setting circuit 500 inputs the driving signal corresponding to the regulated voltage value into the low-side driver 501. The low-side driver 501 drives the signal line connected to an output terminal of the low-side driver 501, depending on the driving signal inputted from the voltage setting circuit 500. The low-side driver 501 includes a switching element, such as a FET, provided between the output terminal to which the signal line is connected and the ground terminal. The voltage setting circuit 500 generates the driving signal having the duty ratio corresponding with the regulated voltage value. The switching element is intermittently activated. Therefore, when the switching element is ON, the electric potential of the output terminal of the low-side driver 501 is almost equal to the electric potential of the ground terminal. When the switching element is OFF, the electric potential of the output terminal of the low-side driver 501 is almost the same as the B terminal voltage in the vehicle generator 1 because the electric potential of the signal line connected to the output terminal is biased by the pull-up resistor 204 within the vehicle power generation controller 2. The voltage setting circuit 500 and the low-side driver 501 correspond to a charging line error detection means.

The charging line disconnection detection circuit 502 corresponds to the charging line error detecting means. The charging line disconnection detection circuit 502 detects an error in the charging line 10 based on the voltage of the output terminal of the low-side driver 501 and the terminal voltage of the on-board battery 3 (the voltage of the positive terminal is obtained via a detection line 300). For example, a state in which the charging line 10 is disconnected from the B terminal of the vehicle generator 1 or the charging line 10 is broken (erroneous states of the charging line 10 such as these are collectively referred to as "charging line disconnection") is detected as an error in the charging line 10. Specifically, the charging line disconnection detection circuit 502 judges that an error has occurred in the charging line 10 when a difference between the voltage of the output terminal of the low-side driver 501 and the terminal voltage of the on-board battery 3 exceeds a predetermined value. A value slightly larger than the voltage drop occurring on the charging line 10 as a result of electrical current supplied to the battery 3 and various electrical loads 4, via the charging line 10, is used as the predetermined value.

The charging line disconnection warning circuit 503 corresponds to a warning means. When the charging line disconnection detection circuit 502 detects an error in the charging line 10, the charging line disconnection warning circuit 502 performs a warning operation to give notification of an error, indicating the charging line disconnection, to a driver of the vehicle. The warning operation is performed, for example, by a notification of the error being displayed on a display device, a predetermined warning lamp being lit, or a predetermined warning sound being sounded by a buzzer or from a speaker.

In this way, the occurrence of an error in the charging line 10 can be detected by the voltage of the signal line transmitting a power generation instruction signal in the vehicle-side ECU 5 being monitored. Therefore, other than the C terminal to which the signal line is connected, a separate external terminal used for error detection is not required to be provided. The number of external terminals in the vehicle power generation controller 2 can be reduced. The structure of the vehicle power generation controller 2 and wire routing can be simplified.

When the switching element within the low-side driver 501 is OFF, the voltage of the output terminal of the low-side driver 501 is obtained and the error detection of the charging line 10 is performed, through use of the pull-up resistor 204 and the low-side driver 501 in combination. As a result, the output voltage of the vehicle generator 1 can be detected and the error in the charging line can be detected without significant change being made to the configurations of the vehicle power generation controller 2 and the vehicle-side ECU 5.

The error is judged to have occurred in the charging line 10 when the difference between the voltage of the output terminal of the low-side driver 501 and the terminal voltage of the on-board battery 3 exceeds the predetermined value. Therefore, the error in the charging line 10 can be easily detected simply through voltage comparison.

What is claimed is:

1. A device for detecting errors in a charging line, in which a power generation instruction signal is transmitted from an external controller to a vehicle power generation controller controlling a power generation state of a vehicle generator and the device detects an error in the charging line connecting the vehicle generator and an on-board battery, the device comprising:

a bias circuit that biases a voltage of an external terminal receiving the power generation instruction signal in the vehicle power generation controller with a voltage of an output terminal of the vehicle generator;

a charging line error detection means that detects errors in the charging line based on a voltage of an output terminal of a power generation instructing means and a terminal voltage of the on-board battery, wherein the error detection means is provided within the external controller and power generation instructing means generates the power generation instruction signal; and a warning means that performs a warning operation to give notification of an errors when the charging line error detecting means detects the error in the charging line.

2. The device according to claim 1, wherein:

the bias circuit is a pull-up resistor;

the power generation instructing means includes a switching element provided between a communication line, connected the external terminal and the output terminal, and a ground terminal; and the charging line error detecting means obtains the voltage of the output terminal and performs the error detection of the charging line when the switching element is OFF.

3. The device according to claim 1, wherein:

the charging line error detecting means judges that an error has occurred in the charging line when a difference between the voltage of the output terminal and the terminal voltage of the on-board battery exceeds a predetermined value.

4. The device according to claim 2, wherein:

the charging line error detecting means judges that an error has occurred in the charging line when a difference between the voltage of the output terminal and the terminal voltage of the on-board battery exceeds a predetermined value.

5. A method for detecting errors in a charging line, in which a power generation instruction signal is transmitted from an external controller to a vehicle power generation controller controlling a power generation state of a vehicle generator and the device detects an error in a charging line connecting the vehicle generator and an on-board battery, the charging line error detection method comprising steps of:

biasing a voltage of an external terminal receiving the power generation instruction signal in the vehicle power generation controller with a voltage of an output terminal of the vehicle generator;

detecting an error in the charging line based on a voltage of an output terminal of a power generation instructing means and a terminal voltage of the on-board battery, wherein the error detection means is provided within the external controller and power generation means generates the power generation instruction signal; and warning to give notification of an error when the charging line error detecting means detects the error in the charging line.

* * * * *